United States Patent [19]

Richards, III et al.

[11] Patent Number: 6,056,579
[45] Date of Patent: May 2, 2000

[54] HOLDER FOR CIRCUIT CARD

[75] Inventors: George Gilman Richards, III, Middletown; Brent David Yohn, Newport; Andrew D. Balthaser, Dauphin; Robert Alan Kirker, Harrisburg; David Todd Shaffer, Mechanicsburg, all of Pa.

[73] Assignee: The Whitaker Corporation, Wilmington, Del.

[21] Appl. No.: 09/116,761

[22] Filed: Jul. 16, 1998

Related U.S. Application Data

[60] Provisional application No. 60/053,460, Jul. 23, 1997.

[51] Int. Cl.⁷ .................................................. H01R 13/627
[52] U.S. Cl. ............................................ 439/358; 439/327
[58] Field of Search ................................... 439/358, 357, 439/326, 327, 328, 260, 267, 325, 377, 157, 152, 64, 67; 211/41.17; 361/740, 741, 749, 756, 759, 732, 752, 754, 798, 801, 802

[56] References Cited

U.S. PATENT DOCUMENTS

| | | |
|---|---|---|
| 3,794,954 | 2/1974 | Reimer .................................... 439/62 |
| 4,858,309 | 8/1989 | Korsunsky et al. ..................... 29/764 |
| 5,002,498 | 3/1991 | Takahashi ............................... 439/326 |
| 5,216,578 | 6/1993 | Zenitani et al. ........................ 361/383 |
| 5,389,000 | 2/1995 | DiVesti et al. ......................... 439/157 |
| 5,419,712 | 5/1995 | Bellomo et al. ....................... 439/327 |
| 5,423,691 | 6/1995 | Pickles ................................... 439/327 |
| 5,863,213 | 1/1999 | Enomoto et al. ...................... 439/326 |
| 5,943,218 | 8/1999 | Liu ......................................... 361/801 |
| 6,007,357 | 12/1999 | Perino et al. ........................... 439/327 |

FOREIGN PATENT DOCUMENTS

| | | |
|---|---|---|
| 936288 | 9/1963 | United Kingdom . |
| 2 303 742 | 2/1997 | United Kingdom ............ H05K 7/14 |

OTHER PUBLICATIONS

International Search Report for corresponding Great Britian case mailed Nov. 27, 1998; 1 page.

*Primary Examiner*—P. Austin Bradley
*Assistant Examiner*—Ross Gushi

[57] ABSTRACT

A circuit card assembly (10) including a circuit card such as a terminator card (12) and a holder (14), insertable into a receptacle connector (20) of a mother board. Card (12) is snapped into the holder and maintained therein so that the assembly is manipulatable as a unit. Latch arms (56, 58) along side sections (52, 54) of the holder latch the assembly into guides (16, 18) of the receptacle connector.

13 Claims, 4 Drawing Sheets

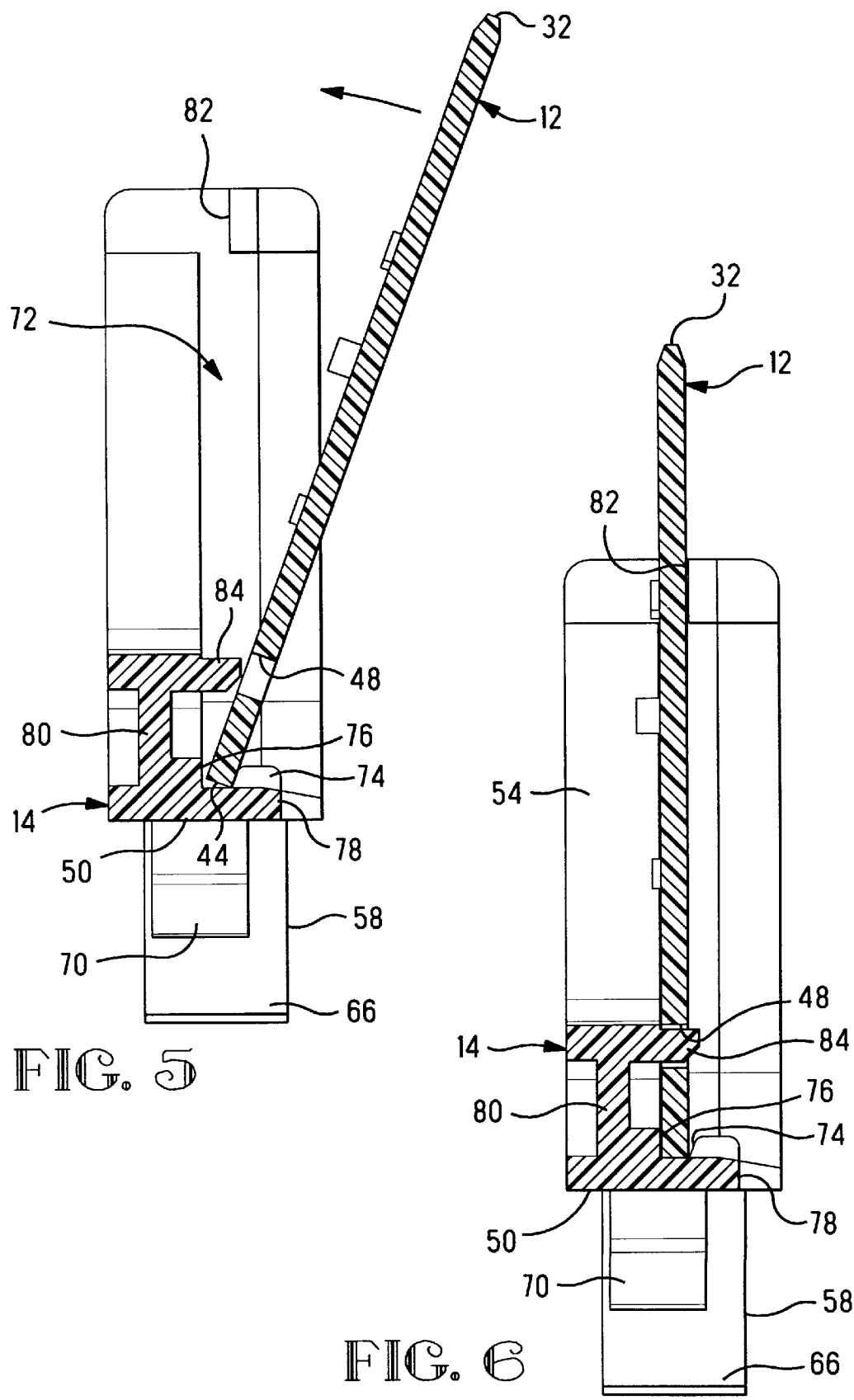

HOLDER FOR CIRCUIT CARD

This application claims benefit of provisional application 60/053,460 Jul. 23, 1997.

FIELD OF THE INVENTION

This relates to the field of electrical connections and more particularly to circuit boards.

BACKGROUND OF THE INVENTION

Computer hardware is being designed to accommodate future upgrades, by adding or replacing various components, and the replaceable components include circuit cards that are contained within processor modules that facilitate handling and protect the components on the cards. Mother boards are provided with receptacle connectors that define sites for an initial processor module and for subsequent placement of such modules, in an array of modules. One such receptacle connector is disclosed in U.S. patent application Ser. No. 09/063,127 filed Apr. 20, 1998 and assigned to the assignee hereof, that provides module guides disposed at ends of the receptacle connector, for facilitating the eventual insertion of a card module thereinto. The guides are pivotable to a position horizontal position until module insertion, thus defining a minimized profile. When such receptacle connectors are in an array on a mother board, the circuits to all the receptacle connectors exist in a bus arrangement. It is desired to provide a terminating component that properly terminates the circuits of the bus, configuring the bus as is appropriate in the absence of a processor module at that location.

SUMMARY OF THE INVENTION

The present invention provides a circuit card assembly of a circuit card and holder, mated with a receptacle connector. A circuit card includes circuits interconnectable with the receptacle connector and thus the mother board, when circuit pads of the card are engaged by contacts of the receptacle connector, and the circuit card may be a terminator card that will later be unmated from the receptacle connector for a processor module to be inserted. The holder grips the terminator card without additional fastener components, facilitating handling of the card, and mimics a module by cooperating with the module guides of the receptacle connector and latching therewith to secure the terminator card in its mated position. The holder is easily delatched from the guides and removed, whereafter a module is then insertable into the module guides.

An embodiment of the present invention will now be disclosed by way of example with reference to the accompanying drawings.

BRIEF DESCRIPTION OF THE DRAWINGS

FIGS. 5 and 6 are cross-sectional views showing the terminator card being assembled to the holder.

DETAILED DESCRIPTION

Figure 1:
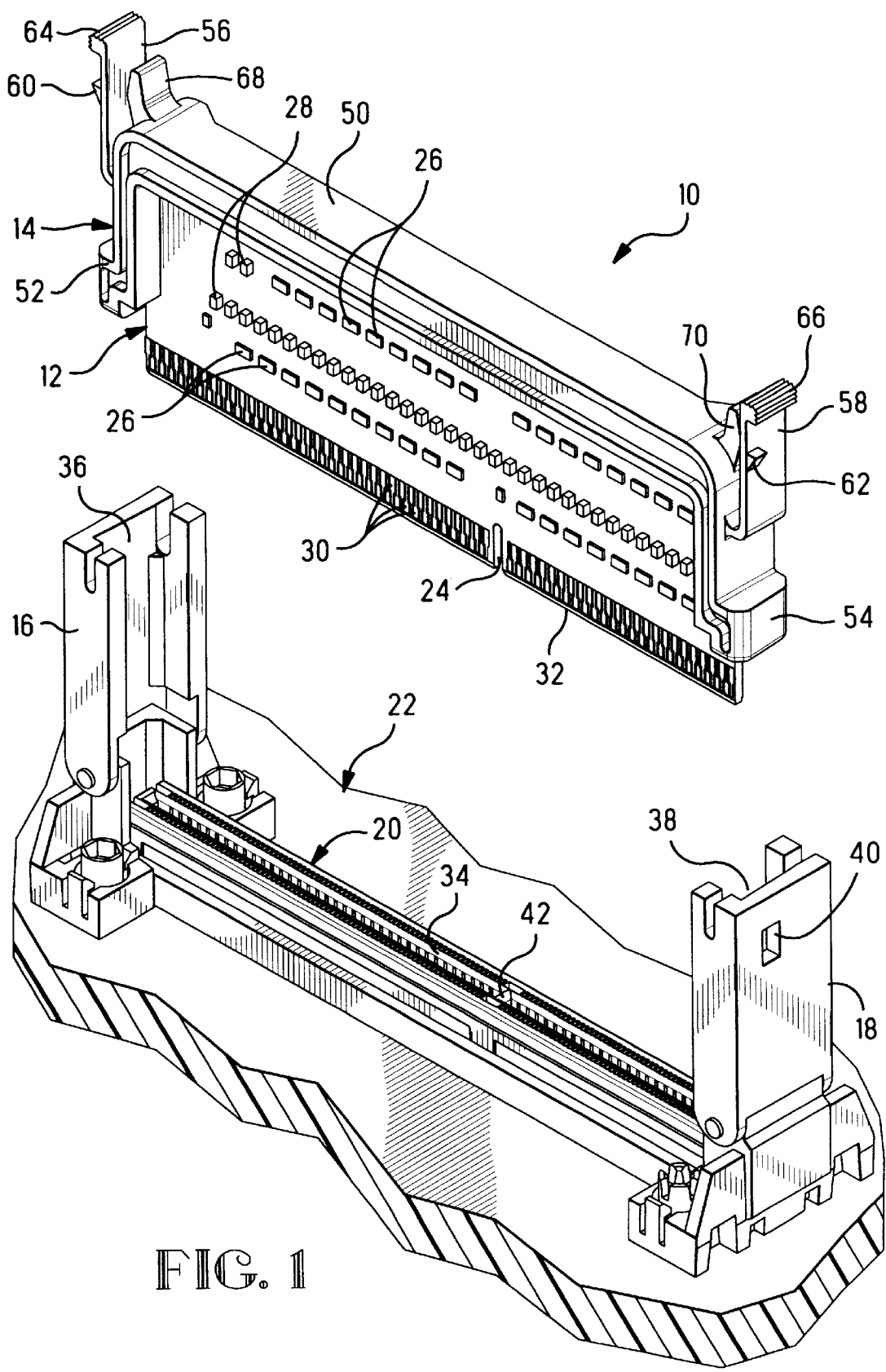
FIGS. 1 and 2 are isometric views of the terminator assembly from forwardly and rearwardly respectively, with a mating connector mounted on a mother board shown in FIG. 1.
Figures 2, 3:
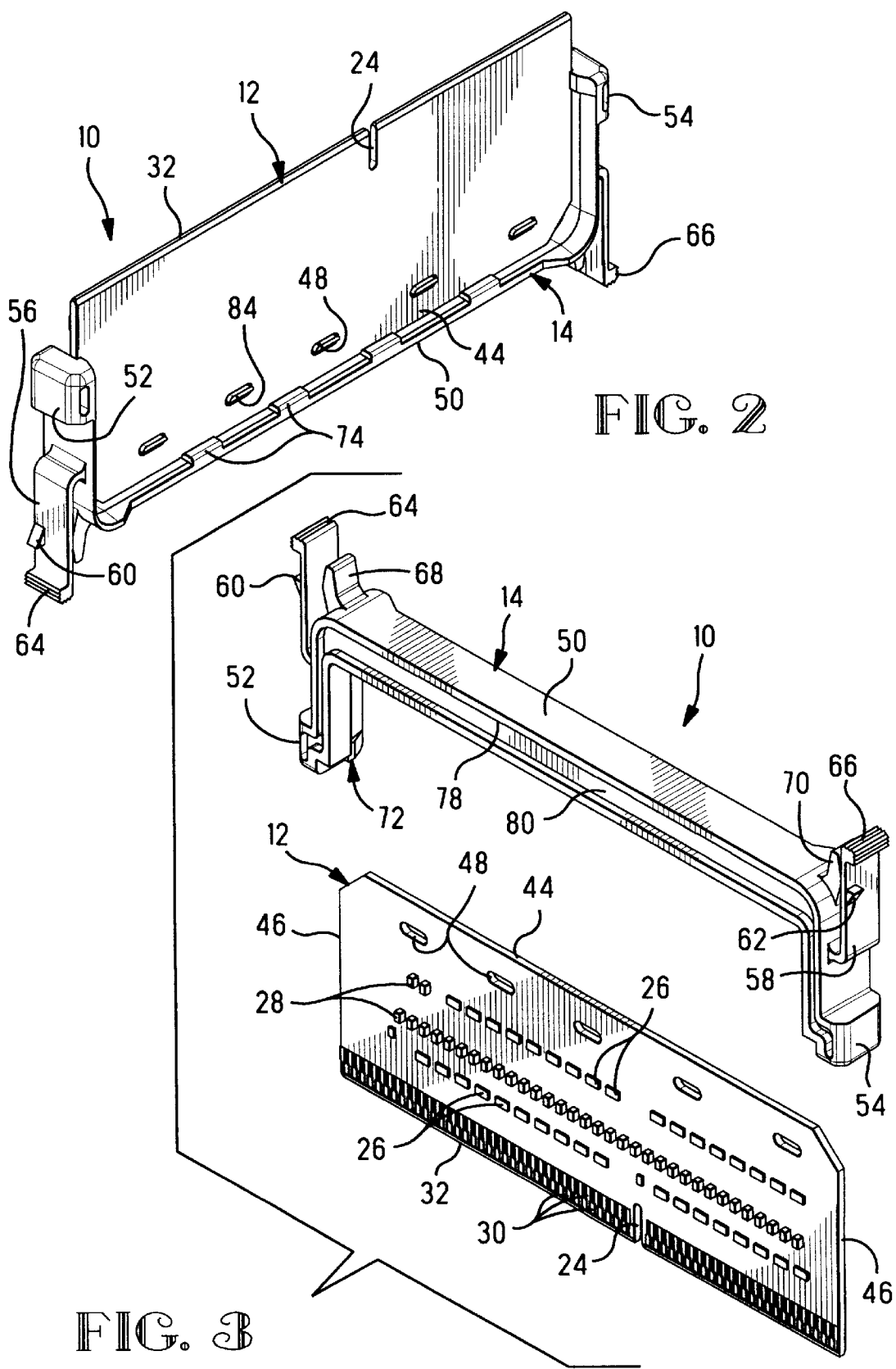
FIGS. 3 and 4 are isometric exploded views of the terminator card exploded from the holder.
Figure 4:
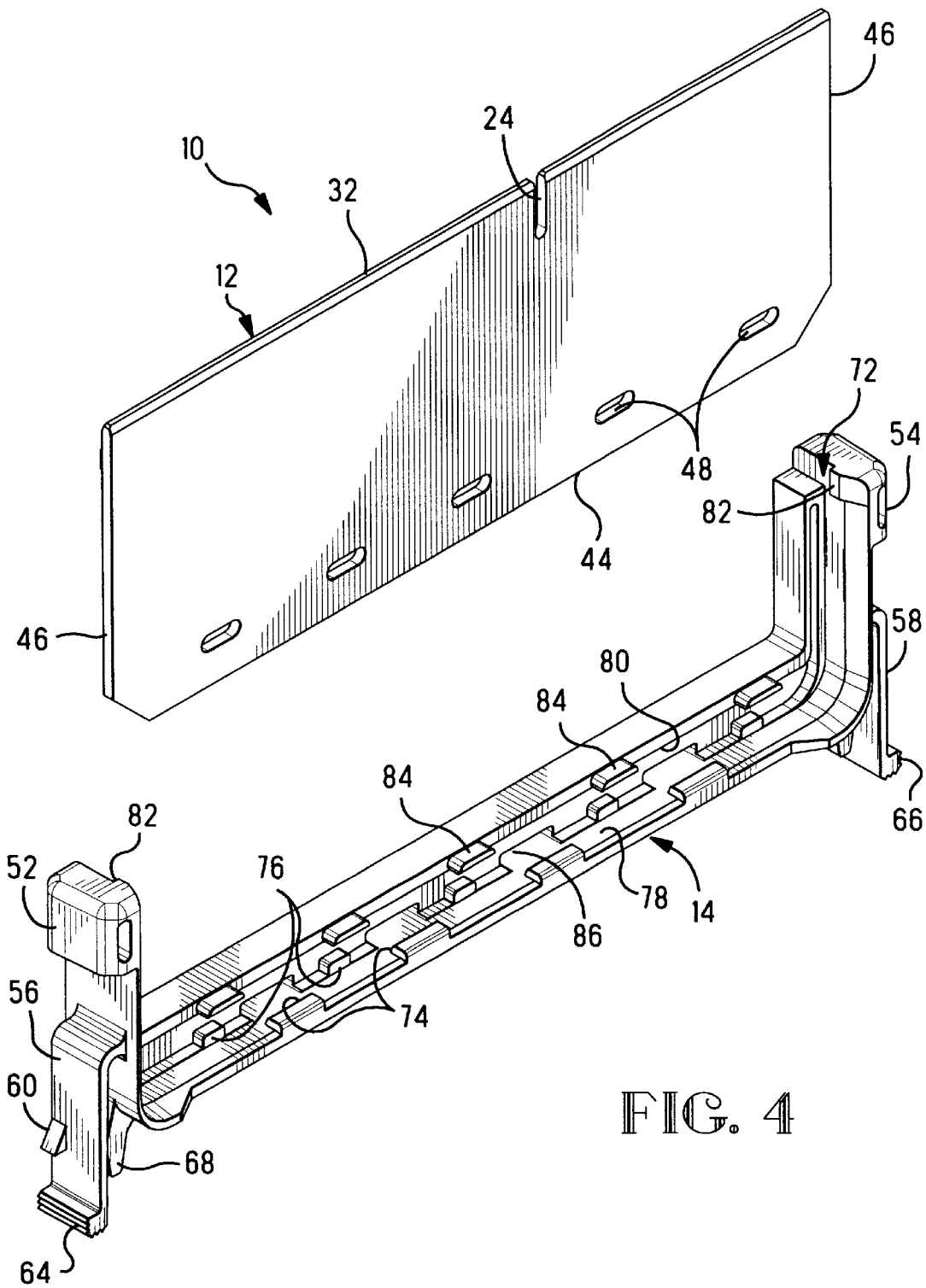

Terminator card assembly 10 includes a terminator card 12 and a holder 14, and is shown to be insertable between a pair of guides 16, 18 for a receptacle connector 20 mounted on a mother board 22. The guides may be as disclosed in U.S. patent application Ser. No. 09/063,127 filed Apr. 20, 1998 or Ser. No. 09/065,633 filed Apr. 23, 1998, both assigned to the assignee hereof.

Terminator card 12 includes an array of circuits and components thereon, including resistors 26 and capacitors 28. The circuits extend to circuit pads 30 along leading edge 32 of the card that become electrically engaged by respective contacts within the receptacle connector, when leading edge 32 is inserted into card-receiving cavity 34 of the connector. Leading edge 32 is seen to include a slot 24 thereinto offset from the center, into which is received a rib 42 in card-receiving cavity 34 of receptacle connector 20 when the card is properly oriented, to permit mating when the card is only in the desired orientation.

Holder 14 includes an elongate body section 50 and a pair of side sections 52, 54 extending forwardly from ends thereof. Each side section 52, 54 is shaped and dimensioned to complement guides 16, 18 for guided receipt therealong when assembly 10 is being assembled to circuit board 22. Side sections 52, 54 preferably are slightly different in shape and/or dimension from each other, and complement slightly differently shaped and/or dimensioned guide channels 36, 38 of the guides, again for polarization. For example, the bottom surfaces of the guide channels may be slightly angled outwardly in the same direction, and the outer surfaces of the side sections correspondingly angled.

A latch arm 56, 58 along an outer surface of each side section is receivable into guide channels 36, 38 of guides 16, 18 when the assembly is being mated with the receptacle connector. Each latch arm 56, 58 includes a latch projection 60, 62 which becomes latched with a corresponding latch recess 40 of each of guides 16, 18 upon fully mated insertion of card leading edge 32 into the card-receiving cavity 34. Each latch arm also includes an actuation section 64, 66 that is manually deflectable inwardly for release from guides 16, 18 for removal of the assembly, with the outer surfaces of the actuation sections 64, 66 provided with knurling to facilitate manual gripping. An antioverstress projection 68, 70 cooperates with actuation section 64, 66 to prevent overdeflection.

Body section 50 defines a card-receiving slot 72 into which terminator card 12 is pivotable for a snap fit. Trailing edge 44 is placed between opposed arrays of low-height stops 74, 76 along end wall 78 and back wall 80 of body section 50, with card 12 oriented at an angle. Card 12 is then pivoted into position toward back wall 80 as side edges 46 of the card pass over and snap behind card latches 82 along inner surfaces of side sections 52, 54 that secure the card in position in slot 72. Bosses 84 of back wall 80 enter apertures 48 of card 12 and serve to maintain the card adjacent the holder body section 50. Holes 86 are vestiges of the molding process, wherethrough extended core pins of the mold apparatus that formed card-adjacent surfaces of stops 74 along end wall 78 of body section 50. To assure that card 12 is insertable into holder 14 in only one orientation, for polarization, it can be seen that the arrays of bosses 84 and corresponding apertures 48 are offset asymmetrically toward a selected one of the side edges 46; thus, the card cannot be fully assembled to the holder unless the card has been appropriately oriented to align the bosses and apertures.

Holder may be molded of thermoplastic material such as glass-filled polyester PBT. The assembly is easily assembled by a snap fit of the card into the holder, thus requiring no additional fastener components for adhesive or bonding materials. After assembly, the terminator card assembly is easily manipulatable as a unit for insertion into the guides of the receptacle connector, and removal therefrom when a processor module is to be inserted into the receptacle connector. The side sections of the holder mimic the side portions of a processor module and cooperate with guides that are shaped and dimensioned to cooperate with the processor module.

Variations and modifications may be made to the holder that are within the spirit and scope of the invention and the scope of the claims. The holder may be utilized with circuit cards other than the card disclosed herein.

What is claimed is:

1. A circuit card assembly, comprising:

a circuit card, and a holder including a body section and side sections extending forwardly from the body section and a card-receiving slot defined by said body section and said side sections, said circuit card being received in a snap fit into said holder such that the circuit card assembly is manipulatable as a unit for insertion into a receptacle connector.

2. The assembly as set forth in claim 1 wherein said circuit card is a terminator card.

3. The assembly as set forth in claim 1 wherein said side sections include latch arms deflectable inwardly and have latch projections along outer surfaces of said latch arms that cooperate with latch recesses of guides of the receptacle connector to secure said assembly in a mated position with the receptacle connector.

4. The assembly as set forth in claim 3 wherein said side sections include antioverstress projections to limit the inward deflection of said latch arms.

5. The assembly as set forth in claim 1 wherein said circuit card is insertable into said slot by being pivoted from an angled orientation to an erect orientation adjacent a back wall of said body section, with a trailing card edge disposed between arrays of stops along said back wall and an end wall of said body section.

6. The assembly as set forth in claim 5 wherein said circuit card is latched behind opposed card latches along inner surfaces of said side sections of said holder upon being pivoted from said angled orientation to said erect orientation.

7. The assembly as set forth in claim 5 wherein said circuit card includes boss-receiving apertures for receipt of bosses along said back wall of said holder body section to maintain said circuit card adjacent said body section.

8. The assembly as set forth in claim 7 wherein said bosses and said boss-receiving apertures are asymmetrically disposed between sides of the holder and circuit card respectively, whereby the card can be assembled to the holder in only one orientation.

9. A holder for handling a circuit card, comprising:

a body section and side sections extending forwardly from the body section, said body section defining a card-receiving slot, said body section having an end wall and a back wall with opposed arrays of stops such that an edge of the circuit card is positionable within the card-receiving slot, said side sections including latches for securing side edges of said circuit card against said back wall.

10. The holder as set forth in claim 9 wherein said side sections include latch arms.

11. The holder as set forth in claim 9 wherein said card is pivotable from an angled position with said edge adjacent said end wall, to an erect position with said circuit card adjacent said back wall.

12. The holder as set forth in claim 11 wherein bosses of said back wall extend through corresponding apertures of said circuit card near said edge, to secure said circuit card adjacent said end wall of said body section.

13. The holder as set forth in claim 12 wherein said bosses are asymmetrically disposed between sides of the holder, the circuit card having correspondingly offset boss-receiving apertures to receive said bosses, whereby the card can be assembled to the holder in only one orientation.

\* \* \* \* \*